United States Patent
Demilier et al.

(10) Patent No.: US 9,568,562 B2
(45) Date of Patent: Feb. 14, 2017

(54) METHOD FOR DETERMINING THE MAGNETISATION OF THE HULL OF A SHIP, AND ASSOCIATED DEVICE

(75) Inventors: Laurent Demilier, Plougastel Daoulas (FR); Yannick Vuillermet, Chambery (FR); Olivier Nicolas Chadebec, Grenoble (FR); Jean-Louis Coulomb, Saint-Ismier (FR); Laure-Line Rouve, Theys (FR); Gilles Cauffet, Saint Quentin sur Isere (FR)

(73) Assignee: DCNS, Paris (FR)

( * ) Notice: Subject to any disclaimer, the term of this patent is extended or adjusted under 35 U.S.C. 154(b) by 1085 days.

(21) Appl. No.: 13/521,303

(22) PCT Filed: Jan. 7, 2011

(86) PCT No.: PCT/FR2011/050024
§ 371 (c)(1),
(2), (4) Date: Oct. 5, 2012

(87) PCT Pub. No.: WO2011/083279
PCT Pub. Date: Jul. 14, 2011

(65) Prior Publication Data
US 2013/0024146 A1    Jan. 24, 2013

(30) Foreign Application Priority Data
Jan. 11, 2010 (FR) ...................................... 10 50138

(51) Int. Cl.
*G01R 33/00* (2006.01)
(52) U.S. Cl.
CPC ........... *G01R 33/00* (2013.01); *G01R 33/0023* (2013.01)

(58) Field of Classification Search
USPC ....................... 702/38, 65, 189, 196; 324/200
See application file for complete search history.

(56) References Cited

U.S. PATENT DOCUMENTS

2003/0184284 A1* 10/2003 Chadebec et al. ............ 324/200
2005/0030021 A1    2/2005 Prammer et al.
2006/0282492 A1   12/2006 Suaya et al.

FOREIGN PATENT DOCUMENTS

FR     2 825 803 A1    12/2002

OTHER PUBLICATIONS

International Search Report, dated Mar. 16, 2011, from corresponding PCT application.

* cited by examiner

*Primary Examiner* — Mohamed Charioui
(74) *Attorney, Agent, or Firm* — Young & Thompson

(57) ABSTRACT

A method of taking a plurality of measurements of the magnetic field using the plurality of sensors; includes assessing the inductive magnetic excitation; and determining the likely distribution of magnetic sources on the surface of the hull by resolving a system of equations derived from modeling the physical phenomena at play, on the basis of the plurality of measurements taken and the assessed inductive magnetic excitation. The model describes the induced magnetic sources as a distribution of dipolar sources and the remanent magnetic sources as a distribution of monopolar sources. A device (6) for determining the magnetization of the hull of a ship for implementing the method is also described.

18 Claims, 4 Drawing Sheets

Figure 1:
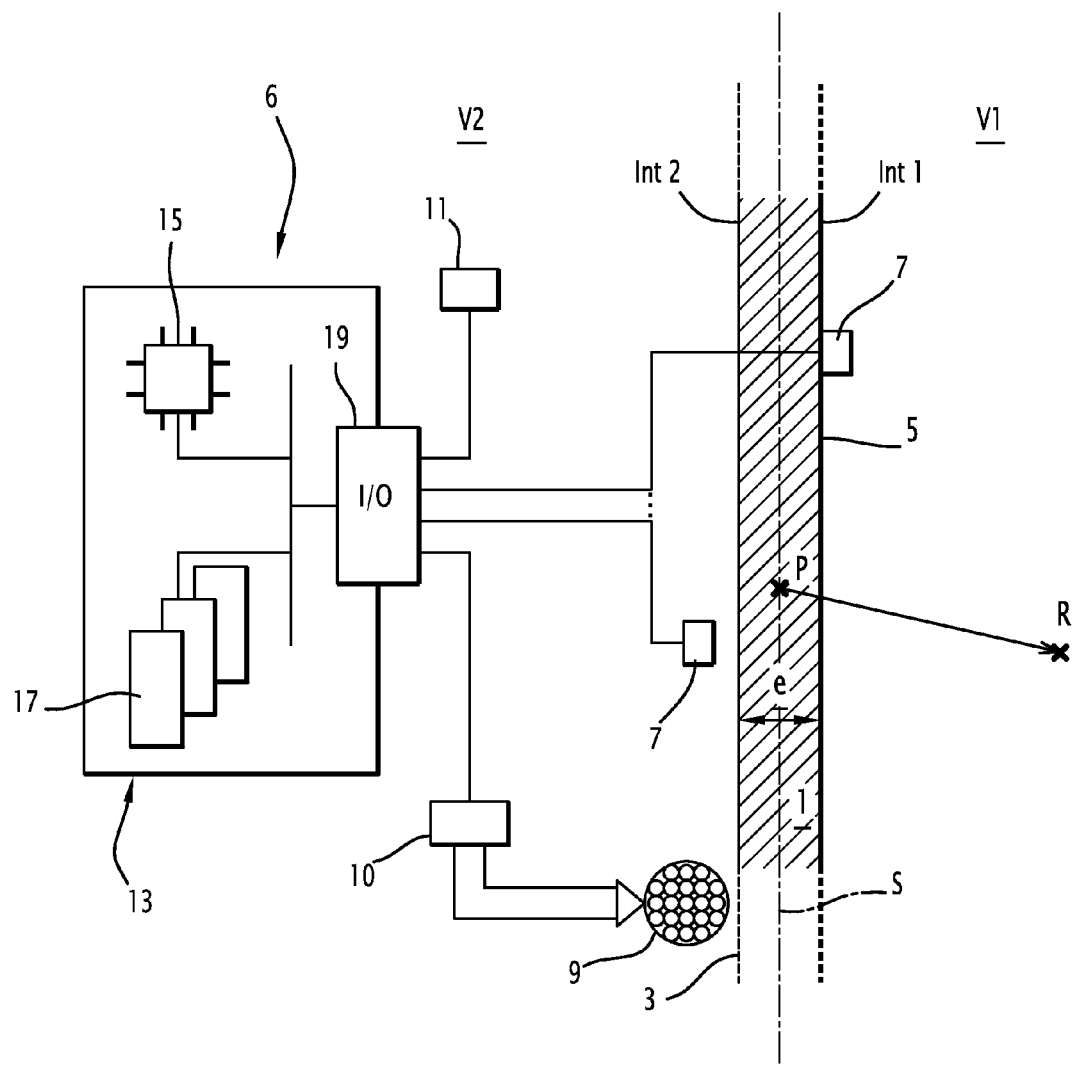

METHOD FOR DETERMINING THE MAGNETISATION OF THE HULL OF A SHIP, AND ASSOCIATED DEVICE

BACKGROUND OF THE INVENTION

Field of the Invention

The invention relates to the technical field of methods for regulating the magnetic signature of a ship.

Description of the Related Art

The signature of a ship is the set of values of the magnetic field created by the ship, evaluated in a reference plane. When it is a surface ship, this reference plane is generally horizontal, situated under the hull of the ship approximately at one times the width of the ship, or typically 10 to 30 m.

FR 2 825 803 discloses a method for regulating the magnetic signature of a ship.

In its portion for determining the signature of the ship, this method provides for acquiring a plurality of measurements of the magnetic field, using a plurality of sensors located inside the hull of the ship.

Then, from this plurality of measurements and the value of the local terrestrial magnetic field, it provides for calculating the most likely magnetization distribution on the surface of the hull using a first model that associates a magnetization distribution with a plurality of measurements of the magnetic field, and a second model that couples the magnetization at one point of the hull with the magnetization at another point of the hull.

The magnetization in question is then the total magnetization at one point of the hull, corresponding to the addition of the permanent magnetization and the magnetization caused at that point.

Lastly, the magnetization distribution thus calculated is used to estimate the value of the magnetic field created by the whole of the reference plane, i.e. the signature of the ship.

In its regulation portion, this method provides for minimizing the signature of the ship thus determined. To that end, the hull of the ship is equipped with several so-called "magnetic immunization" loops, made from a material conducting the electrical current, and the ship stores electrical power means making it possible to circulate suitable electrical currents in each of the loops independently. The circulation of a current in a loop generates a magnetic field that is superimposed on the local terrestrial magnetic field and on the field created by the magnetization distribution on the hull, knowing that the latter is modified by the magnetic field generated by the loops. Thus, by regulating the electrical currents circulating in the different loops, the signature of the ship is minimized.

The precision of this method rests on the representativeness of the plurality of measurements of the magnetic field using the plurality of sensors situated inside the hull and on the aptitude of the first and second models to precisely determine the magnetization of the hull from the measurements resulting from the sensors.

When the sensors are located inside the hull, far from it, the method allows a satisfactory determination of the magnetization of the hull corresponding to the measurements done.

However, the measurement in the air of the magnetic field created by the hull is disrupted. In fact, a ship contains secondary magnetic sources, such as the ferromagnetic masses that make up its engines. These secondary magnetic sources produce secondary magnetic fields that are superimposed on the magnetic field created by the hull. The secondary magnetic fields represent a strong disruption for the information one seeks to obtain by using the sensors. Also, the measurements are not very representative of the magnetic field resulting from the magnetization of the hull. As a result, the magnetization of the hull calculated from the measurements done inside the ship is not precisely representative of the actual magnetization of the hull. As a result, the signature of the ship thus calculated may be very different from the actual signature of the ship.

To improve the ratio of the relevant signal to the disruption, it has been considered to bring the sensors closer to the hull, to position them in the immediate vicinity thereof, and to move them away from the secondary magnetic sources as much as possible.

However, when the sensors are brought closer to the hull, the signature determined by the implementation of the method described in document FR 2 825 803 no longer corresponds to the actual signature of the ship.

SUMMARY OF THE INVENTION

The invention therefore aims to offset this problem by proposing a method for determining the magnetization of the hull of a ship making it possible to obtain, from magnetic field measurements done using sensors onboard the ship, a solution that is robust and that is not disrupted by parasitic magnetic field sources contained in the hull of the ship.

The invention therefore relates to a method for the real-time determination of the magnetization of the hull of a ship, the hull of the ship being made from a ferromagnetic material and subjected to an inductive magnetic excitation, and the ship being provided with a plurality of magnetic field sensors positioned at predetermined points relative to the hull, comprising the following steps: a)—acquiring a plurality of measurements of the magnetic field using the plurality of sensors; b)—assessing the inductive magnetic excitation; and c)—determining a likely distribution of magnetic sources on the surface of the hull by resolving a system of equations derived from a modelization of the physical phenomena at play, on the basis of the plurality of measurements taken and the assessed inductive magnetic excitation, in said modelization, the induced magnetic sources being described by a distribution of dipolar sources and the remanent magnetic sources being described as a distribution of monopolar sources.

According to specific embodiments, the method comprises one or more of the following features, considered alone or according to all possible combinations:
  said modeling comprises:
    a first model associating a magnetization distribution in the ferromagnetic material with measurements of magnetic field; and
    a second model relative to the behavior of the ferromagnetic material, describing the coupling between a magnetic source at one point of the material, with a magnetic source at another point of the material;
  the method uses a transform T making it possible to associate at least one distribution of monopolar sources with a distribution of dipolar sources and/or a transform T* making it possible to associate at least one distribution of dipolar sources with a distribution of monopolar sources;
  said modelization uses a virtual model of the hull of the ship comprising a primary mesh made up of a plurality of planar and polygonal elementary surfaces;

by elementary surface of the primary mesh, the distribution of dipolar sources is uniform and tangential to said surface element;
the distribution of monopolar sources is discretized at the nodes of the primary mesh;
said system of equations to be resolved is written:

$$\begin{pmatrix} A_M & A_M \cdot T^* \\ D_M + Id & D_M \cdot T^* \end{pmatrix} \begin{pmatrix} p_i^{ind} \\ Q_i^{rem} \end{pmatrix} = \begin{pmatrix} m \\ S_M \end{pmatrix}$$

with:
m a vector whereof the $j^{th}$ component is the difference $H(R_j)-H_0(R_j)$ between the measurement of the magnetic excitation done at point $R_j$ by the $j^{th}$ magnetic field sensors and the value of the inductive magnetic excitation at point $R_j$;
$A_M$ a matrix whereof the element $A_{M\,ji}$ is the operator $$\frac{1}{4\pi} \int_{L_i} (u_i \cdot \vec{n}_i) \frac{R_i R_j}{R_i R_j^3} dL_i(R_i)$$

associated with an elementary surface $S_i$ of the primary mesh having a plurality of edges $L_i$, each having a normal $\vec{n}_i$ in the plane of the elementary surface $S_i$ and oriented toward the outside of said elementary surface, and where $u_i$ is a pair of vectors forming a basis of the elementary surface;
$S_M$ is a vector whereof the $i^{th}$ component is proportional to the inductive magnetic excitation $e\chi H_{0i}$ at a point of the $i^{th}$ elementary surface of the primary mesh;
$D_M$ is a matrix whereof the element $D_{M\,ji}$ is the operator $$-\frac{\chi e}{4\pi} \int_{L_i} (u_i \cdot \vec{n}_i) \frac{R_j R_i}{|R_j R_i|} dL_i(R_i);$$

and
T a transformation matrix such that $(Q_i^{rem})=T(\vec{p}_i^{rem})$, whereof the pseudo-inverse is denoted $T^*$;
the determination of the likely distribution of magnetic sources involves a preconditioning procedure;
the determination of the likely distribution of magnetic sources involves a singular value decomposition procedure.

The invention also relates to a method for the real-time determination of the magnetic signature of a ship, comprising a step for the real-time determination of the magnetization of the hull of the ship using the preceding method, making it possible to obtain a likely distribution of magnetic sources on the surface of the hull, then an additional step consisting of calculating the signature of the ship from said likely distribution of magnetic sources.

The invention also relates to a method for the magnetic immunization of a ship, the ship being provided with a plurality of immunization loops having predetermined geometries relative to the hull of the ship and power supply means capable of being controlled so as to cause suitable currents to circulate in the immunization loops, independently of one another, comprising, in addition to the steps of the preceding method for the real-time determination of the signature of the ship, a step consisting of estimating the different currents to be circulated in the immunization loops.

so as to modify the signature of the ship, and a step consisting of controlling the power supply means so as to cause said estimated currents to circulate in the immunization loops.

The invention also relates to a device for the real-time determination of the magnetization of the hull of a ship, the hull of the ship being made from a ferromagnetic material subjected to an inductive magnetic excitation. This device comprises: a plurality of magnetic field sensors positioned at predetermined points relative to the hull; means for determining the inductive magnetic excitation; and a computation unit connected to the plurality of sensors and to the means for determining the inductive magnetic excitation, capable of executing the instructions of a computer program to implement the preceding method for the real-time determination of the magnetization of the hull of a ship or the preceding method for the real-time determination of the signature of a ship.

According to specific embodiments, the device comprises one or more of the following features, considered alone or according to all possible combinations:
at least one sensor from the plurality of sensors is glued on the hull;
at least one sensor from the plurality of sensors is a biaxial sensor measuring the components of the magnetic field that are tangential to the hull;
at least one sensor from the plurality of sensors is placed outside the hull of the ship.

The invention also relates to a device for the magnetic immunization of a ship of the type including a plurality of immunization loops having predetermined geometries relative to the hull of the ship, power supply means for the immunization loops, and means for controlling the power supply means of the immunization loops, the control means including a device for the real-time determination of the magnetization of the hull capable of calculating the signature of the ship.

The devices presented above are advantageously onboard the ship whereof the magnetization of the hull is determined.

BRIEF DESCRIPTION OF THE DRAWING FIGURES

Figure 2:
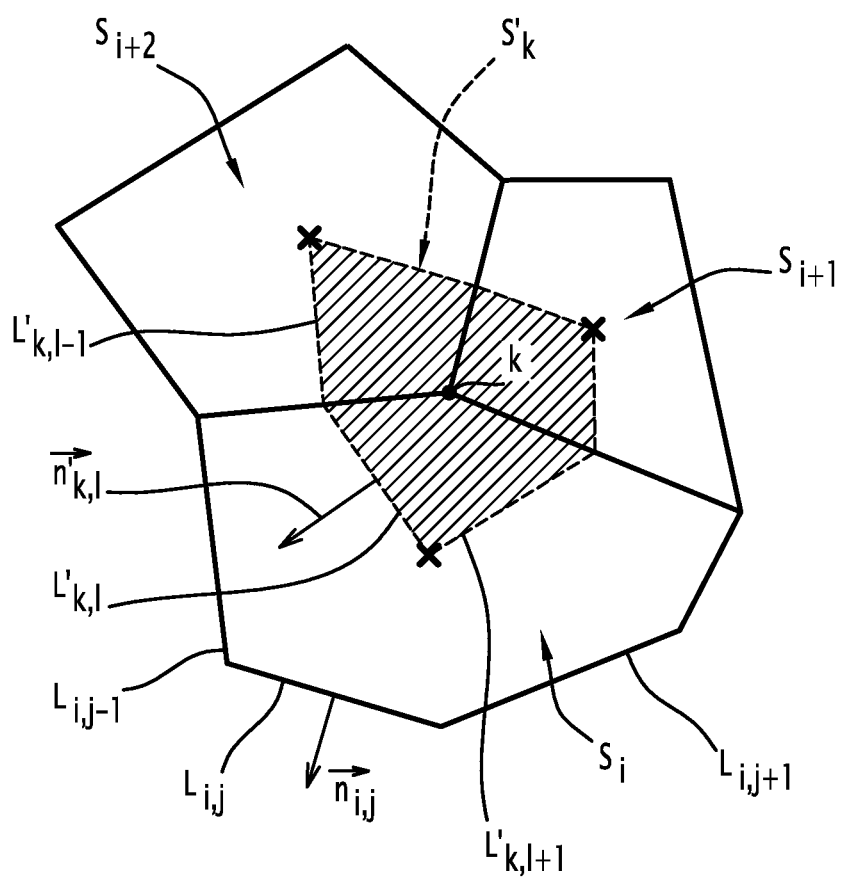
Figure 3:
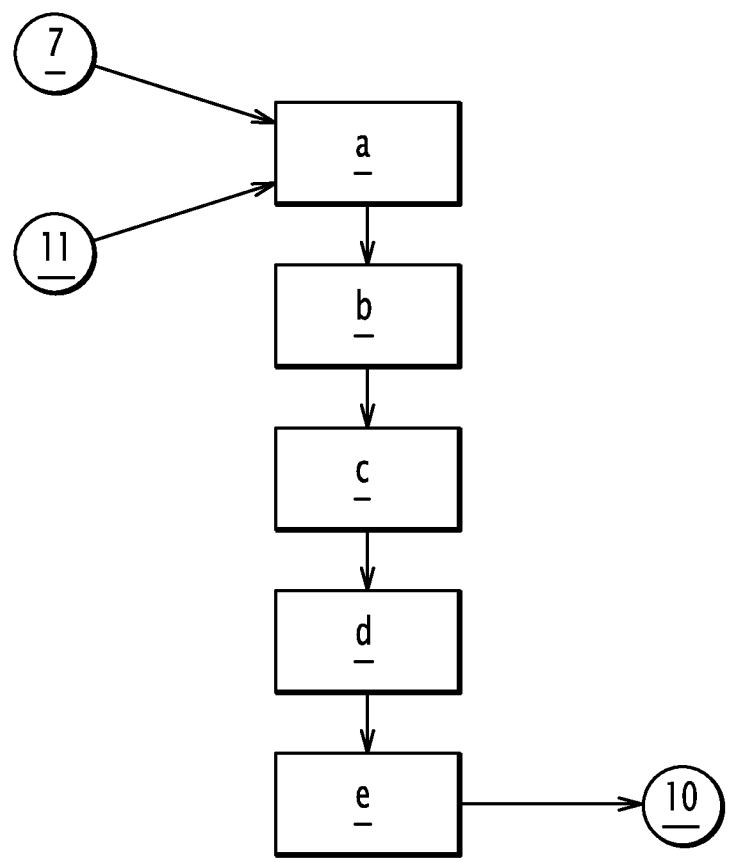
Figure 4:
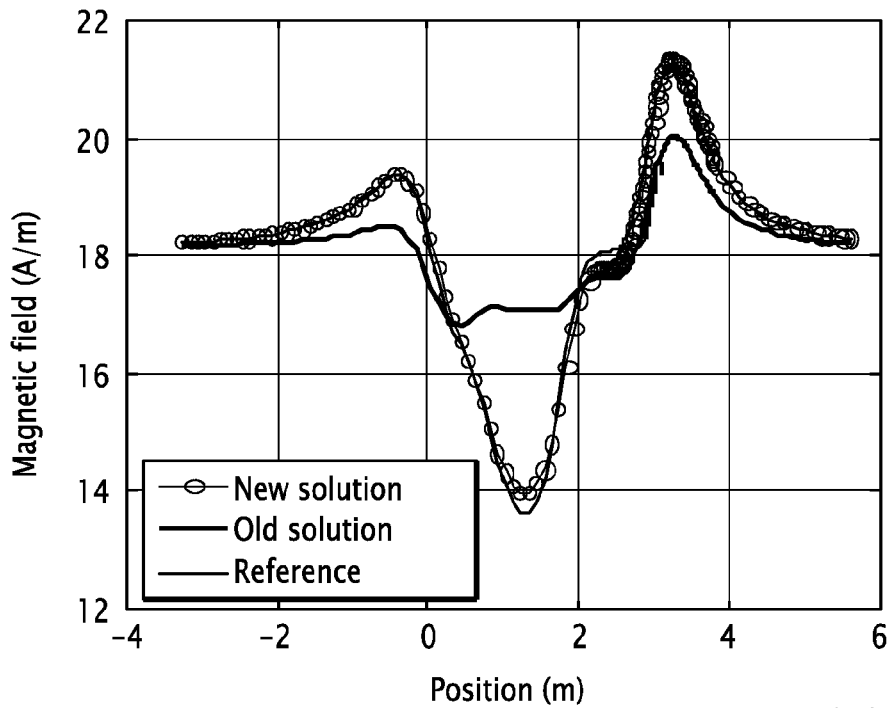
Figure 5:
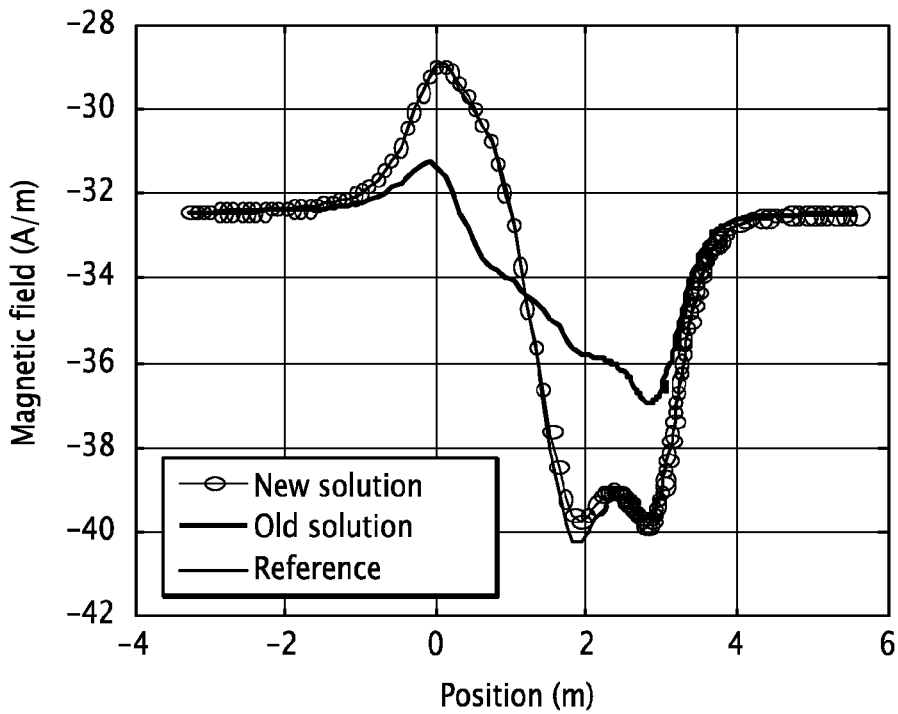

The invention and the advantages thereof will be better understood upon reading the following description, provided solely as an example, and done in reference to the appended drawings, in which:
FIG. 1 is a diagrammatic illustration of the facility making it possible to regulate the signature of a ship;
FIG. 2 is an illustration of a portion of the mesh of the hull and its dual meshing;
FIG. 3 is a flowchart illustrating the regulation method; and
FIGS. 4 and 5 are graphs providing the value of the signature for different longitudinal positions under the hull of the ship.

DETAILED DESCRIPTION OF THE INVENTION

Device

The ship for which one wishes to regulate the magnetic signature comprises a hull 1 that is made by assembling sheets of metal. The sheets of metal used are made from a ferromagnetic material characterized by a reversible magnetic susceptibility $\chi$.

The hull has an inner surface 3, oriented toward the inside of the ship, and an outer surface 5, oriented toward the outside of the ship.

The ship contains a device, indicated by general reference 6 in FIG. 1, for the real-time determination of the magnetization of the hull of a ship. The device 6 is capable of implementing the methods for determining the magnetization of the hull of a ship, and for determining the signature of the ship and magnetic immunization of the ship.

The device 6 comprises a plurality of magnetic field sensors 7. For example, 50 sensors are positioned in the volume V2 inwardly delimited by the inner surface 3 of the hull 1. The sensors 7 are placed close to the inner surface 3 and, preferably, glued on that surface. From a practical standpoint, this is a mixture between biaxial and triaxial sensors. In the case at hand, the sensors 7 being glued to the hull or, at the very least, very close thereto, only the measurements of the components of the magnetic induction B tangent to the hull are taken into account. In fact, the measurement of the normal component of the magnetic induction B has an unfavorable signal-to-noise ratio and including it in models could be catastrophic in terms of convergence toward a robust solution, i.e. a solution that is stable relative to the measurement uncertainties. The information added by this normal component not being very representative, it is not taken into account in the method according to the invention. The position of each sensor 7 relative to the hull is known.

The device 6 also comprises a plurality of immunization loops 9 for circulation of an electric current. The loops 9 are made from an electrically conducting material. The loops 9 are independent of one another. They form electric circuits of known geometry and positioning relative to the hull.

The device 6 comprises power supply means 10 that can be controlled so as to cause suitable currents to circulate in each of the loops 9 independently of one another.

The circulation of a current in a loop 9 generates a magnetic excitation H capable of causing a distribution of magnetization in the hull 1. In this way, the different loops 9 make it possible to modify the value of the inductive magnetic excitation $H_0$.

The device 6 comprises means 11 for assessing the inductive magnetic excitation $H_0$. These may for example be means making it possible to assess, at a given moment, both the terrestrial magnetic excitation at the location where the ship is situated, and the magnetic excitation induced by the immunization loops at each point of the hull of the ship.

The device 6 comprises a computation unit 13 capable of carrying out the different steps of the methods for determining the magnetization of the hull, determining the signature of the ship, and immunization, described in detail below.

Preferably, the unit 13 includes a processor 15 and a storage unit 17, such as a read-only memory and a random-access memory. It also includes an input/output interface 19 to which the sensors 7, the means 11, and the power supply means 10 are connected.

Upon each time interval, the computation unit 13 runs a computer program whereof the instructions are stored in the storage unit 17.

The execution of this program carries out the different steps of the method for magnetic immunization of the ship, shown diagrammatically in FIG. 3. This method comprises the following steps:

a)—acquiring a plurality of measurements of the magnetic field using the plurality of sensors;

b)—assessing the inductive magnetic excitation;

c)—determining a likely distribution of magnetic sources on the surface of the hull by resolving a system of equations derived from modeling the physical phenomena at play, on the basis of the plurality of measurements taken and the assessed inductive magnetic excitation, d)—calculating the signature of the ship from the likely distribution of magnetic sources; and e)—controlling the power supply means so as to circulate suitable currents in the loops, to modify the magnetic excitation of the inductors and, consequently, to regulate the signature of the ship.

Step c) implements modeling of the physical phenomena, a virtual model of the hull of the ship to discretize that modeling and obtain a system of equations to be resolved, and mathematical methods for resolving said equations. These elements will first be presented.

General Information

The magnetic signature of the ship is given by the set of values of the magnetic induction at different points of a reference surface. For a surface ship, said reference surface is a portion of a plane situated under the hull, for example at approximately 10 meters. For a submarine, this reference surface is a portion of a coaxial cylinder outside the substantially cylindrical hull.

The magnetic induction on this reference surface results from the superposition on the one hand of the terrestrial magnetic induction and the magnetic induction created by the current loops equipping the ship, and on the other hand, by the magnetic induction created by the magnetization M carried by the hull.

The magnetization M(P) at a point P of the ferromagnetic hull includes an induced component $M^{ind}$, proportional to the total magnetic excitation H(P) at the point P ($M^{ind}=\chi H$), and a remanent component $M^{rem}$, resulting from the magnetic history of the hull.

The total magnetic excitation H(P) at a point P of the ferromagnetic hull includes a so-called inductive component $H_0$, independent from the material, coming from the terrestrial magnetic excitation and the magnetic excitation created by the different current loops, and a so-called reduced component $H^{red}$, dependent on the material, resulting from the magnetization M(P') at all of the other points P' of the hull.

The reduced magnetic excitation $H^{red}$ has mathematical properties that are similar to those of an electrostatic field. In particular, $H^{red}$ derives from a potential $\phi$: $H^{red}=-\text{grad}\phi$ Model of the Hull It will be considered that the hull is a thin ferromagnetic medium, reduced to a surface S, with a thickness e.

Passage Conditions Through the Hull

The main characteristic of ferromagnetic materials is their capacity to channel the flow of the magnetic excitation. This property is amplified when the thickness of the ferromagnetic material is reduced relative to the other characteristic dimensions of the material and if the magnetic permeability $\chi$ of the material is high.

These conditions being verified in the case of the hull of a ship, the normal component $H_n$ of the total magnetic excitation H is null, i.e. the total magnetic excitation H in the material is considered tangent to the hull, and its tangential component $H_t$ is constant in the thickness of the hull.

The passage conditions at the first interface between the material of the hull and the volume located outside the hull (indicator 1 in FIG. 1), the passage conditions at the second interface between the material of the hull and the volume located inside the hull (indicator 2 in FIG. 1), and the hypothesis that the hull is reduced to a surface S lead to the continuity of the potential φ and the discontinuity of the normal differential $$\frac{\partial \varphi}{\partial n}$$

of the potential φ when passing through the surface S being written as follows:

$$\varphi_1 = \varphi_2$$
$$\frac{\partial \varphi_1}{\partial n} - \frac{\partial \varphi_2}{\partial n} \neq 0$$

Modeling of the Magnetic Sources

Because the reduced magnetic excitation $H^{red}$ behaves like an electrostatic field, the sources of said reduced excitation $H^{red}$ are modeled either by distributions of monopolar sources or by distributions of dipolar sources, as is known by those skilled in the art to model electrostatic fields.

The distributions of acceptable sources must meet the passage conditions indicated above.

Surface Distribution of Charges

The first distribution meeting the passage conditions is the surface distribution of charges or distribution of monopolar sources, denoted q(P).

The passage conditions are then written as follows:

$$\varphi_1 = \varphi_2$$
$$\frac{\partial \varphi_1}{\partial n} - \frac{\partial \varphi_2}{\partial n} = -q(P)$$

When passing through the surface S, the reduced magnetic excitation $H^{red}$ follows the equation: $H^{red}_1 - H^{red}_2 = q(P) \cdot \vec{n}$, where indicators 1 and 2 respectively refer to the outside volume and the inside volume delimited by the surface S of the hull, and $\vec{n}$ is the vector normal to the surface S, at point P of the surface S.

This vectorial equation indicates that the tangential component of the reduced magnetic excitation $H_{red}$ is preserved, and jumps from its normal component through the surface S.

Such a distribution of monopolar sources creates, at any point R, a reduced potential and a reduced magnetic excitation:

$$\varphi(R) = \frac{1}{4\pi} \int \int_s \frac{q(P)}{|PR|} dS(P) \quad (1)$$

$$H^{red}(R) = \frac{1}{4\pi} \int \int_s q(P) \frac{PR}{PR^3} dS(P)$$

where P is a current point of the surface S of the hull; and PR is the vector joining points P and R.

Surface Distribution of Tangential Dipoles

The surface S of the hull bears a surface distribution of dipolar sources, denoted $\vec{p}(P)$ at a point P of the surface S. The passage conditions for this distribution are written as follows:

$$\varphi_1 - \varphi_2 = p_n(P)$$
$$\frac{\partial \varphi_1}{\partial n} - \frac{\partial \varphi_2}{\partial n} = -div_S \vec{p}_t(P)$$

where $p_n(P)$ and $\vec{p}_t(P)$ respectively represent the normal component and the tangential component relative to the surface S of the distribution $\vec{p}(P)$; and $div_S$ represents the divergence operator stressed on the surface S.

In this way, a surface distribution of dipolar sources $\vec{p}(P)$ that are tangential to the surface S of the hull meets the passage conditions through the surface S. In the following, the indicator t will be omitted.

Upon passage through the surface S, the reduced magnetic excitation $H^{red}$ follows the equation:

$$H^{red}_1 - H^{red}_2 = -[div_S \vec{p}(P)] \cdot \vec{n}$$

Such a distribution of dipolar sources creates, for any point R, a reduced potential and a reduced excitation:

$$\varphi(R) = \frac{1}{4\pi} \int \int_s \vec{p}(P) \cdot \frac{PR}{PR^3} dS(P) \quad (2)$$

$$H^{red}(R) = \frac{1}{4\pi} \int \int_s grad\left(\vec{p}(P) \cdot \frac{PR}{PR^3}\right) dS(P)$$

where P is a current point of the surface S of the hull; and PR is the vector joining points P and R.

Comments

These two distributions of sources, by charge and by dipoles, represent the same physical phenomenon and create the same magnetic excitation at any point R. This requires that:

$$div_S \vec{p}(P) = -q(P)$$

Furthermore, a magnetized volume Ω creates a potential having for expression:

$$\varphi(R) = \frac{1}{4\pi} \int \int_\Omega \int M(P) \cdot \frac{PR}{PR^3} d\Omega(P)$$

where M(P) is the magnetization at a point P of the material.

The magnitude M(P) being constant along the thickness e of the sheet, the volume integral may be replaced by a surface integral. The change is made from a triple integral on the elementary volume dΩ of the hull to a double integral on an elementary surface dS (which is not a vector).

Comparing the expression of the potential as a function of $\vec{p}$ and the expression of the potential as a function of M leads to: $\vec{p} = eM$, while the relationship between $\vec{p}$ and q leads to: $q = -e div_S M$.

Continuous Modeling of Physical Phenomena

First Modeling

The magnetization distribution M(P) in the hull, which is the sum of the induced magnetization $M^{ind}$ and the remanent magnetization $M^{rem}$, generates a magnetic excitation at a point R in the air that assumes, according to equation (2), the form:

$$H(R) = H_0(R) + H^{red}(R) \quad (3)$$

$$= H_0(R) + \frac{1}{4\pi}\int\int_\Omega\int grad\left(M(P)\cdot\frac{RP}{RP^3}\right)d\Omega(P)$$

By reversing this relationship, the first modeling, commonly called modeling of the inverse problem, makes it possible to determine the magnetization distribution M(P), from a plurality of measurements of the magnetic excitation at predetermined points R and from the knowledge of the inductive magnetic excitation $H_0(R)$.

Second Modeling

The induced magnetization $M^{ind}$ at a point P of the hull is proportional to the total magnetic excitation H(P) at that point P:

$$M^{ind}(P) = \chi H(P)$$

Or:

$$M^{ind}(P) = \chi\left[H_0(P) + \frac{1}{4\pi}\int\int_\Omega\int grad\left(M(P')\cdot\frac{PP'}{PP'^3}\right)d\Omega(P')\right] \quad (4)$$

This relationship translates the behavior of the material. It couples the response of the material at point P, i.e. the induced magnetization $M^{ind}(P)$ at point P, with the total magnetization $M(P')=M^{ind}(P')+M^{rem}(P')$ at each of the other points P' of the hull.

Discretization of the First and Second Modelings

The surface distributions of magnetic sources are discretized.

To that end, a virtual model of the hull is used. This model comprises a mesh made up of a plurality of elementary surfaces that make up an approximation of the surface S.

This mesh comprises N polygonal and planar elementary surfaces $S_i$. Each elementary surface $S_i$ is limited by a plurality of edges $L_{i,j}$. The edges of the different surfaces come together in N' nodes k (cf. FIG. 2).

Dipolar Sources

The distribution of dipolar sources $\vec{p}(P)$, where P is a current point of the surface S of the hull of the ship, is considered uniform over each elementary surface $S_i$ of the mesh. It is written $\vec{p}_i$.

With $\vec{p}_i = eM_i = eM_i^{ind} + eM_i^{rem} = \vec{p}_i^{ind} + \vec{p}_i^{rem}$, the discretization of equation (3) leads to:

$$H(R) = H_0(R) + \frac{1}{4\pi}\sum_i^N \int\int_{S_i} grad_s\left(\vec{p}(P)\cdot\frac{PR}{PR^3}\right)dS_i(P)$$

where PR is the value connecting point P, of the elementary surface $S_i$, to point R.

With:

$$\int\int_{\Omega_i}\int grad\left(M_i(P)\cdot\frac{PR}{PR^3}\right)d\Omega_i(P) = \int\int_{S_i^{ext}} grad_s\left(\vec{p}_i(P)\cdot\frac{PR}{PR^3}\right)d\vec{S}_i^{ext}(P)$$

Where $\Omega_i$ is an elementary volume of the hull obtained by translating the elementary surface $S_i$ over a length equal to the thickness e along a normal to the elementary surface $S_i$. $S_i^{ext}$ is the closed outer surface of said elementary volume $\Omega_i$, oriented from the inside out.

In considering the different magnitudes to be constant along the thickness e of the volume $\Omega_i$, the preceding expression becomes:

$$\int\int_{S_i} grad_s\left(\vec{p}_i(P)\cdot\frac{PR}{PR^3}\right)dS_i(P) = \sum_j \int_{L_{i,j}} (\vec{p}_i(P)\cdot\vec{n}_{i,j})\frac{PR}{PR^3}dL_{i,j}(P)$$

where $\vec{n}_{i,j}$ is the normal along the edge $L_{i,j}$, situated in the plane of the elementary surface $S_i$ and oriented toward the outside of said elementary surface. In the following, for greater clarity, the indicators j on the different edges of a same elementary surface are omitted, the sum over the different linear integrals becoming a contour integral.

From which, $$H(R) = H_0(R) + \frac{1}{4\pi}\sum_i^N \int_{L_i}\left[(\vec{p}_i^{ind}(P) + \vec{p}_i^{rem}(P))\cdot\vec{n}_i\right]\frac{PR}{PR^3}dL_i(P) \quad (5)$$

Or, in matrix form:

$$(A_M \quad A_M)\cdot\begin{pmatrix}\vec{p}_i^{ind}\\\vec{p}_i^{rem}\end{pmatrix} = m$$

With:

m a vector whereof the $j^{th}$ component is the difference $H(R_j)-H_0(R_j)$ between the measurement of the magnetic excitation done at point $R_1$ where the $j^{th}$ sensor is placed, and the value of the inductive magnetic excitation at point $R_j$; and $A_M$ the matrix whereof the element $A_{M\,ji}$ is the operator associated with an elementary surface $$S_i: \frac{1}{4\pi}\int_{L_i}(u_i\cdot\vec{n}_i)\frac{R_iR_j}{R_iR_j^3}dL_i(R_i).$$

Where $u_i$ is a vector ordered pair forming a base associated with the elementary surface $S_i$ of decomposition of the $\vec{p}_i$ By using equation (4), at a point P of the elementary surface $S_i$, we have:

$$\vec{p}_i^{ind}(P) = eM_i^{ind}(P) = e\chi H_{0i} + \frac{\chi}{4\pi}\sum_j^N \int\int_{S_j} grad_s\left(\vec{p}_j(P')\cdot\frac{PP'}{PP'^3}\right)dS_j(P')$$

where it has been considered that the inductive excitation $H_0(P)$ is uniform over the surface $S_i$ and is equivalent to $H_{0i}$.

With $$\int\int_{S_j} grad_s\left(\vec{p}_j(P')\cdot\frac{PP'}{PP'^3}\right)dS_j(P') = \int_{L_j}(\vec{p}_j(P')\cdot\vec{n}_j)\frac{PP'}{PP'^3}dL_j(P'),$$

one finally arrives at:

$$\frac{\vec{p}_i^{ind}(P)}{e} - \frac{\chi}{4\pi} \sum_{j}^{N} \int_{L_j} (\vec{p}_j(P') \cdot \vec{n}_j) \frac{PP'}{PP'^3} dL_j(P') = e\chi H_{0i}$$

Which can be written in matrix form:

$$(Id + D_M \quad D_M) \cdot \begin{pmatrix} \vec{p}_i^{ind} \\ \vec{p}_i^{rem} \end{pmatrix} = S_M$$

With:
$S_M$ a vector whereof the $i^{th}$ component is proportional to the inductive magnetic excitation $e\chi H_{0i}$ at a point of the $i^{th}$ elementary surface of the mesh; and
$D_M$ the matrix whereof the element $D_{Mji}$ is the operator $$-\frac{\chi e}{4\pi} \int_{L_i} (u_i, \vec{n}_i) \frac{R_j R_i}{|R_j R_i|^3} dL_i(R_i),$$

where $R_i$ is the position of the barycenter of the elementary surface $S_i$.

These equations are vectorial. Considering only its projection in the plane of each elementary surface, this leads to a system of 2N equations with 2N unknowns. These equations relative to the magnetic behavior of the material make up what we call the second modeling.

Monopolar Sources

In the monopolar description, the charges are substantially proportional to the magnetic flow escaping at the interface between the sheet and the air. However, the magnetic excitation and the sheet being oriented tangentially, the magnetic flow tends to escape primarily through the edges of the hull model. The method provides for the production of an overview of the magnetic flow on each of the edges of a dual mesh associated with the elementary surfaces $S_i$ of the primary mesh. The elements relative to this dual mesh will be described below. The dual mesh comprises N' elementary surfaces $S'_k$, each being associated with a node k of the primary mesh.

As shown in FIG. 2, a dual elementary surface $S'_k$ is associated with a node of the primary mesh. Each dual elementary surface $S'_k$ is built from the barycenters of the different elementary surfaces $S_i$ containing the considered node k and the middles of the edges starting from that node i.

The charge $Q_k$ condensed at the node k is defined by:

$$Q_k = \iint_{S'_k} q \, dS'_k$$

where $S'_k$ is the dual elementary surface associated with the node k of the primary mesh.

The discretization of equation (1) leads to:

$$H(R) = H_0(R) + \frac{1}{4\pi} \sum_{k}^{N'} Q_k(R_k) \frac{R_k R}{R_k R^3}$$

Where the point $R_k$ corresponds to the position of the node k.

By distinguishing between the induced charge and remanent charge in the total charge $Q_k$, i.e. $Q_k = Q_k^{ind} + Q_k^{rem}$, one obtains:

$$H(R) = H_0(R) + \frac{1}{4\pi} \sum_{k}^{N'} (Q_k^{ind}(R_k) + Q_k^{rem}(R_k)) \frac{R_k R}{R_k R^3} \quad (6)$$

or, in matrix form:

$$(A_Q \quad A_Q) \cdot \begin{pmatrix} Q_i^{ind} \\ Q_i^{rem} \end{pmatrix} = m$$

With:
m a vector whereof the $j^{th}$ component is the difference $H(R_j)-(R_j)$ between the measurement of the magnetic excitation done at point $R_j$ where the $j^{th}$ sensor is placed and the value of the inductive magnetic excitation at point $R_1$; and $A_Q$ the matrix whereof the coefficient $A_{Q\,ki}$ is the operator associated with a dual elementary surface $$S'_k : \frac{1}{4\pi} \frac{R_k R_i}{R_k R_i^3}.$$

To discretize the second modeling coupling the monopolar charges to one another, one has:

$$q = -e \, div_S M$$

$$Q_k = \iint_{S'_k} q \, dS'_k = -e \iint_{S'_k} div_S M \, dS'_k$$

$$Q_k^{ind} = -e \iint_{S'_k} div_S M^{ind} \, dS'_k$$

By using equation (4), one has:

$$Q_k^{ind} = -e \iint_{S'_k} div_S [\chi H_0(P) + \chi H^{red}(P)] dS'_k(P)$$

Then, by injecting equation (6) into the preceding equation, one has:

$$Q_k^{ind} + \frac{e\chi}{4\pi} \left( \sum_{l}^{N'} (Q_l^{ind} + Q_l^{rem}) \iint_{S'_k} div_S \left[ \frac{R_l P}{R_l P^3} \right] dS'_k(P) \right) =$$

$$-e \iint_{S'_k} div_S [\chi H_0(P)] dS'_k(P)$$

Lastly, by applying Ostrogradsky's formula to an elementary volume corresponding to the extrusion, over a thickness e, of the elementary surface $S'_k$ of the dual mesh associated with the node k, or:

$$-e \iint_{S'_k} div_S V \, dS'_k = -e \int_{L'_k} V \cdot \vec{n}'_k \, dL'_k$$

where $\vec{n}_k$ is a normal to the edge $L'_k$ situated in the plane of the associated elementary surface, one obtains:

$$Q_k^{ind}(R_k) + \frac{e\chi}{4\pi}\left(\sum_{l}^{N'} (Q_l^{ind}(R_l) + Q_l^{rem}(R_l)) \int_{L'_k} \frac{R_l R_k}{R_l R_k^3} \cdot \vec{n}'_k \cdot dL'_k(R_k)\right) = \quad (7)$$

$$-e\chi \int_{L'_k} H_0(R_k) \cdot \vec{n}_k \, dL'_k(R_k)$$

or, in matrix form:

$$(Id + D_Q \quad D_Q) \cdot \begin{pmatrix} Q_i^{ind} \\ Q_i^{rem} \end{pmatrix} = S_Q^2$$

With:
$S_Q$ a vector whereof the $k^{th}$ component is given by the expression $-e\chi \int_{L'_k} H_0(R_k) \cdot \vec{n}_k dL'_k(R_k)$ relative to the $k^{th}$ dual elementary surface $S'_k$; and $D_Q$ the matrix whereof the coefficient $D_{Q,ji}$ is the operator $$\frac{e\chi}{4\pi} \int_{L'_j} \frac{R_i R_j}{R_i R_j^3} \cdot \vec{n}'_j dL'_j(R_j).$$

Equations to be Resolved
Synthetically, the equations to be resolved are the following:
In the description in dipolar sources:

$$\begin{pmatrix} A_M & A_M \\ D_M + Id & D_M \end{pmatrix} \begin{pmatrix} p_i^{ind} \\ p_i^{rem} \end{pmatrix} = \begin{pmatrix} m \\ S_M \end{pmatrix} \quad (A)$$

In the description in monopolar sources:

$$\begin{pmatrix} A_Q & A_Q \\ D_Q + Id & D_Q \end{pmatrix} \begin{pmatrix} Q_i^{ind} \\ Q_i^{rem} \end{pmatrix} = \begin{pmatrix} m \\ S_Q \end{pmatrix} \quad (B)$$

The solution to these systems of equations is not unique since, in most cases, the number of sensors used (i.e. the number of coordinates of the vector m), is lower than the number of sources sought (i.e. N dipolar sources and N' monopolar sources). To obtain a solution, a singular value decomposition (SVD) procedure is used. This mathematical tool, known by those skilled in the art, makes it possible to determine the minimum norm solution from among all of the possible solutions. Preferably, a quadratic norm is used in this singular value decomposition procedure.

Once the solution is obtained, the magnetic field on the reference surface is evaluated using equations (5), equation system (A), or (6), equation system (B).

Transformation for Going from Description in Dipolar Sources to Description in Monopolar Sources According to the method of the prior art, a system of equations is resolved according to one or the other of equation systems (A) and (B). The obtained solution is relatively precise in the case where the sensors of the magnetic field are far enough away from the hull of the ship. Otherwise, when the sensors are close or glued to the hull of the ship, the obtained solution is distorted and is consequently not satisfactory.

The method according to the invention resolves another system of equations (C). Equation system (C) derives from the combinations of both systems of equation (A) and (B), so as to precisely and robustly model both the vectorial appearance of the problem, in particular the link between the measurements of the magnetic fields and the sources, and the scalar aspect of the problem, in particular the mutual coupling between the sources on the surface of the hull. The solution obtained by resolving system of equations (C) is precise, even when the magnetic field sensors are positioned close to the hull.

To that end, the method according to the invention uses a transform T making it possible to go from the distribution of dipolar sources $\vec{p}_i$ to the distribution of monopolar sources $Q_k$: $(Q_k)=T(\vec{p}_i)$.

With:

$$Q_k = \iint_{S'_k} q(P) dS'_k(P) \; et \; q(P) = -div_s \vec{p}(P)$$

It is shown that:

$$Q_k = \sum_{l}^{d_k} \vec{p}_l \cdot \int_{L'_{k,l}} \vec{n'_{k,l}} dL'_{k,l}(P) \quad (7)$$

Where:
$d_k$ is the number of dual edges $L'_{k,l}$ associated with the dual elementary surface $S'_k$ of the node k;

$\vec{n}_{k,l}$ the exiting normal at the considered dual edge $L'_{k,l}$; and $\vec{p}_l$ the value of the tangential dipolar magnetization along the considered dual edge $L'_{k,l}$, this magnetization being constant along a dual edge and corresponding to the magnetization of the elementary surface $S_i$ on which the considered dual edge is located.

By applying relationship (7) to all of the elements of the mesh, a matrix T is obtained making it possible to go from distribution in dipolar sources to distribution in monopolar sources: $(Q_k)=T(\vec{p}_i)$ The coefficients of the matrix T depend on the geometry of the chosen primary mesh.

The pseudo-inverse T* of the transform T, i.e. the generalization of the reverse matrix to the matrices that are not square, makes it possible to go from distribution in monopolar sources to distribution in dipolar sources: $(\vec{p}_i)=T^*(Q_j)$.

Furthermore, by using the transform T only for the remanent magnetizations, system of equations (C) is written:

$$\begin{pmatrix} A_M & A_M \cdot T^* \\ D_M + Id & D_M \cdot T^* \end{pmatrix} \begin{pmatrix} \vec{p}_i^{ind} \\ Q_i^{rem} \end{pmatrix} = \begin{pmatrix} m \\ S_M \end{pmatrix} \quad (C)$$

with:

m the vector whereof the $j^{th}$ component is the difference $H(R_j)-H_0(R_j)$ between the measurement of the magnetic excitation done at point $R_j$ by the $j^{th}$ magnetic fields sensors and the value of the inductive magnetic excitation at point $R_j$;

$A_M$ the matrix whereof the element $A_{M\ ij}$ is the operator $$\frac{1}{4\pi} \int_{L_i} (u_i \cdot \vec{n}_i) \frac{R_i R_j}{|R_i R_j|^3} dL_i(R_i)$$

associated with an elementary surface $S_i$ of the primary mesh, having a plurality of edges $L_i$, each having a normal $\vec{n}_i$ in the plane of the elementary surface $S_i$ that is oriented toward the outside of said elementary surface, and where $u_i$ is a vector ordered pair forming a decomposition base for the elementary surface $S_i$;

$S_M$ the vector whereof the $i^{th}$ component is proportional to the inductive magnetic excitation $e\chi H_{0i}$ at a point of the $i^{th}$ elementary surface $S_i$ of the mesh; and $D_M$ the matrix whereof the element $D_{M\ ij}$ is the operator $$-\frac{\chi e}{4\pi} \int_{L_j} (u_j \cdot \vec{n}_j) \frac{R_i R_j}{|R_i R_j|^3} dL_j(R_j);$$

and

T the transformation matrix, such that $(Q_i^{rem})=T(\vec{p}_i^{rem})$, whereof the pseudo-inverse is denoted T*.

The unknowns $\vec{p}_i^{ind}$ are first eliminated from the system. We have:

$$(\vec{p}_i^{ind})=(D_M+ID)^{-1}\cdot(S_M-D_MT^*)(Q_i^{rem}) \quad (8)$$

and, consequently:

$$(Q_i^{rem})=((-A_M(D_M+Id)^{-1}\cdot D_M+A_M)T^*)^* \cdot (m-A_M(D_M+Id)^{-1}S_M) \quad (9)$$

A similar system of equations could be written from the $A_Q$ and $D_Q$ of equation system (B).

Rebalancing the Weight of the Sources

In order to give the same weight to all of the elementary surfaces of the primary mesh during resolution of equation system (C), and so as not to bias the solution by favoring an elementary surface located across from a magnetic field sensor 7 relative to the other elementary surfaces of the primary mesh, the method according to the invention provides a procedure for rebalancing the equation system (C).

To that end, a procedure, also known in itself, for preconditioning rectangular matrices is used.

In general, let A be any rectangular matrix. $W_g$ and $W_d$ are the diagonal square matrices whereof the terms are respectively the inverses of the norms of the rows and columns of A. The matrix $A_1$ is then defined by:

$$A_1 = W_g \cdot A \cdot W_d$$

This procedure tends to decrease the influence of the most significant coefficients of the matrix A.

In the case of equation (9), the preconditioning procedure preferably relates to the matrix $-A_M\cdot(D_M+ID)^{-1}\cdot D_M+A_M)$ T*.

By applying the preconditioning procedure to the latter set of equations, one obtains:

$$(Q_i^{rem})=W_d(W_g\cdot((-A_M(D_M+ID)^{-1}\cdot D_M+A_M)\cdot T^*\cdot W_d)\\ *\cdot W_g\cdot(m-A_M(D_M+Id)^{-1}S_M)$$

The unknowns $Q_i^{rem}$ are obtained using the preceding expression, then the unknowns $\vec{p}_i^{ind}$ are calculated from equation (8).

Lastly, the magnetic field created by the hull of the ship in the reference plane is calculated using the corresponding part of equation (6) for the contribution of the remanent monopolar sources $Q_i^{rem}$ and using the corresponding part of equation (5) for the contribution of the induced dipolar sources $\vec{p}_i^{ind}$.

The preceding steps of the method for determining the magnetization of the hull of the ship and the method for determining the signature of the ship make up the steps necessary for a magnetic immunization method of the ship consisting of regulating the magnetic signature of the ship in real-time.

To regulate the magnetic signature of the ship, preferably to minimize the magnetic signature of the ship, the computation means of the ship determine a plurality of electric currents suitable to be respectively applied to the immunization loops with which the ship is equipped.

The computation means transmit these suitable electric currents as instructions to the power supply means of the different immunization loops. The power supply means apply a current corresponding to the required suitable current as input for each of the loops.

As a result, the currents circulating in the different immunization loops generate an inductive magnetic excitation modifying the total magnetic excitation $H_0$.

Once the electric currents are established, the method for determining the magnetization of the hull of the ship is again carried out taking this modification of the magnetic excitation $H_0$ into account, so as to determine a new value of the magnetization. The method for determining the signature of the ship is then iterated with the new likely value of the distribution of the magnetization on the surface of the hull.

Through successive iterations, the magnetic signature of the ship is minimized.

Furthermore, in one alternative embodiment of the method for determining the magnetization, the singular value decomposition (SVD) procedure is modified. In a traditional SVD, a solution is sought that minimizes a predefined criterion using a norm, such as "the least squares." In the present alternative embodiment, a solution is sought whereof the deviation from a reference solution minimizes the chosen criterion.

This reference distribution is advantageously the minimal norm distribution determined during a preceding iteration of the method for determining the magnetization.

This reference distribution can also be a distribution of magnetic sources measured using a device adapted to a moment in the magnetic history of the ship. This measurement may for example be done in a naval shipyard, before the ship takes to the sea, using a stationary device.

In this way, the idea is transcribed that between the moments $t-\delta t$ and $t$, the magnetization distribution on the surface of the hull has evolved from the magnetization distribution at t−δt, i.e. the reference distribution, and that the distribution at moment t does not need to be very "far" from the reference distribution.

It should be noted that this alternative of the method for determining the magnetization of the hull is independent of the equation system one seeks to resolve. It may be implemented for other systems of equations such as systems (A) or (B).

This alternative has the advantage of leading to a more robust minimal norm magnetization distribution then in the singular value decomposition procedure traditionally used. It should be noted that it has been observed that the solution obtained by implementing the present invention is much more robust than the solutions obtained using the resolution methods of the prior art, irrespective of the distance between the sensors and the surface of the ferromagnetic hull. The qualifier "robust" traditionally means that the solution is modified little or not at all by disruptions or noises.

The method for determining the magnetization of the hull of a ship according to the present invention was implemented on a model at a scale of $\frac{1}{30}^{th}$ of a double-hulled submarine.

FIGS. 4 and 5 are graphs making it possible to compare the signature of the hull calculated using the method according to the prior art and according to the inventive method with the actual signature measured by a sensor. The signature is evaluated here along an axis parallel to the longitudinal axis of the hull and located 10 m below the latter, position 0 corresponding to the vertical of the center of gravity of the hull. The graph of FIG. 4 shows the longitudinal component of the magnetic field, while the graph of FIG. 5 shows the vertical component of that same field. The magnetic field sensors are glued on the outer wall of the inner hull of the submarine. A very significant correlation was observed between the signature calculated according to the present invention and the actual signature of the ship.

The method according to the invention allows a precise calculation of the signature by bringing the sensors closer to the hull, said sensors advantageously being positioned on the outside of the ferromagnetic hull of the ship. For example, in the case of a submarine comprising a ferromagnetic inner hull and a hydrodynamic outer hull, the sensors are advantageously placed between the two hulls. This arrangement makes it possible to reduce, inside the inner hull, the bulk caused by the sensors and their electrical connections. Furthermore, the inner hull constituting a magnetic shield, it makes it possible to considerably reduce, or even cancel, on the outside thereof, the secondary magnetic fields generated by the inner secondary sources, such as the engines. The magnetic field measurements done by the sensors located on the outside of the inner hull thus come even closer to the magnetic field of interest, i.e. the magnetic field generated by the magnetization distribution on the surface of the hull. The solution to which the inventive method leads is all the more accurate as a result.

Within the meaning of the invention, the terms "close to the hull" or "glued to the hull" applied to a magnetic field sensor mean that the element of said sensor that is sensitive to the magnetic field is placed between 0 and 10 cm from the surface oriented toward the outside of the ship or the surface oriented toward the inside of the ship of the ferromagnetic hull for which one wishes to calculate the signature.

The invention claimed is:
1. A method for the real-time determination of the magnetization of the hull of a ship, the hull of the ship being made from a ferromagnetic material and subjected to an inductive magnetic excitation, and the ship being provided with a plurality of magnetic field sensors positioned at predetermined points relative to the hull, comprising the following steps:
   a) acquiring a plurality of measurements of a magnetic field using the plurality of sensors;
   b) assessing the inductive magnetic excitation; and
   c) determining a likely distribution of magnetic sources on the surface of the hull by resolving a system of equations derived from a modelization of physical phenomena at play, on the basis of the plurality of measurements taken and the assessed inductive magnetic excitation,
   wherein, in said modelization, induced magnetic sources are described by a distribution of dipolar sources, and remanent magnetic sources are described by a distribution of monopolar sources, and
   wherein said modelization comprises:
      executing a first model associating a magnetization distribution in the ferromagnetic material with the measurements of the magnetic field; and
      executing a second model, relative to a behavior of the ferromagnetic material, describing a coupling between a magnetic source at one point of the material with a magnetic source at another point of the material.

2. The method according to claim 1, wherein the method uses a transform T making it possible to associate at least one distribution of monopolar sources with a distribution of dipolar sources and/or a transform T* making it possible to associate at least one distribution of dipolar sources with a distribution of monopolar sources.

3. The method according to claim 2, wherein said modelization uses a virtual model of the hull of the ship comprising a primary mesh made up of a plurality of planar and polygonal elementary surfaces.

4. The method according to claim 3, wherein by elementary surface of the primary mesh, the distribution of dipolar sources is uniform and tangential to said surface element.

5. The method according to claim 4, wherein the distribution of monopolar sources is discretized at the nodes of the primary mesh.

6. The method according to claim 5, wherein said system of equations to be resolved is written:

$$\begin{pmatrix} A_M & A_M \cdot T^* \\ D_M + Id & D_M \cdot T^* \end{pmatrix} \begin{pmatrix} p_i^{ind} \\ Q_i^{rem} \end{pmatrix} = \begin{pmatrix} m \\ S_M \end{pmatrix}$$

with:
   m, a vector whereof the j$^{th}$ component is the difference $H(R_j)-H_0(R_j)$ between the measurement of the magnetic excitation done at point $R_j$ by the j$^{th}$ magnetic field sensors and the value of the inductive magnetic excitation at point $R_j$;
   $A_M$, a matrix whereof the element $A_{M\,ji}$ is the operator $$\frac{1}{4\pi} \int_{L_i} (u_i \cdot \vec{n}_i) \frac{R_i R_j}{R_i R_j^3} dL_i(R_i)$$

associated with an elementary surface $S_i$ of the primary mesh having a plurality of edges $L_i$, each having a normal $\vec{n}_i$ in the plane of the elementary surface $S_i$ and oriented toward the outside of said elementary surface, and where $u_i$ is a pair of vectors forming a basis of the elementary surface;

$S_M$, a vector whereof the $i^{th}$ component is proportional to the inductive magnetic excitation $e\chi H_{Oi}$ at a point of the $i^{th}$ elementary surface of the primary mesh;

$D_M$, a matrix whereof the element $D_{M ji}$ is the operator $$-\frac{\chi e}{4\pi}\int_{L_i}(u_i\cdot\vec{n}_i)\frac{R_jR_i}{|R_jR_i|^3}dL_i(R_i);$$

and

T, a transformation matrix such that $(Q_i^{rem})=T(\vec{p}_i^{rem})$ whose pseudo-inverse is denoted T*.

7. The method according to claim 1, wherein the determination of the likely distribution of magnetic sources involves a preconditioning procedure.

8. The method according to claim 1, wherein the determination of the likely distribution of magnetic sources involves a singular value decomposition procedure.

9. A method for the real-time determination of the magnetic signature of a ship, comprising a step for the real-time determination of the magnetization of the hull of the ship using the method according to claim 1, making it possible to obtain a likely distribution of magnetic sources on the surface of the hull, and then an additional step consisting of calculating the signature of the ship from said likely distribution of magnetic sources.

10. A method for the magnetic immunization of a ship, the ship being provided with a plurality of immunization loops having predetermined geometries relative to the hull of the ship and power supply means capable of being controlled so as to cause suitable currents to circulate in the immunization loops, independently of one another, the method comprises, in addition to the steps of the method according to claim 9 for the real-time determination of the signature of the ship, a step comprising estimating the different currents to be circulated in the immunization loops so as to modify the signature of the ship, and a step consisting of controlling the power supply means so as to cause said estimated currents to circulate in the immunization loops.

11. A device for the real-time determination of the magnetization of the hull of a ship, the hull of the ship being made from a ferromagnetic material subjected to an inductive magnetic excitation ($H_0$), comprising:

a plurality of magnetic field sensors positioned at predetermined points relative to the hull;

means for determining the inductive magnetic excitation; and a computation unit connected to the plurality of sensors and to the means for determining the inductive magnetic excitation, capable of executing the instructions of a computer program to implement the method according to claim 1 for the real-time determination of the signature of a ship.

12. The device according to claim 11, wherein at least one sensor from the plurality of sensors is glued on the hull.

13. The device according to claim 11, wherein at least one sensor from the plurality of sensors is a biaxial sensor measuring the components of the magnetic field that are tangential to the hull.

14. The device according to claim 11, wherein at least one sensor from the plurality of sensors is placed outside the hull of the ship.

15. A device for the magnetic immunization of a ship including a plurality of immunization loops having predetermined geometries relative to the hull of the ship, power supply means for the immunization loops, and means for controlling the power supply means of the immunization loops, wherein the control means include a device according to claim 11 capable of calculating the signature of the ship.

16. The device according to claim 11, wherein the device is onboard the ship whereof the magnetization of the hull is determined.

17. The device according to claim 12, wherein at least one sensor from the plurality of sensors is a biaxial sensor measuring the components of the magnetic field that are tangential to the hull.

18. The method according to claim 3, wherein the distribution of monopolar sources is discretized at the nodes of the primary mesh.

* * * * *